(12) United States Patent
Kim et al.

(10) Patent No.: US 12,433,093 B2
(45) Date of Patent: Sep. 30, 2025

(54) DISPLAY DEVICE INCLUDING A PHOTO SENSOR

(71) Applicant: Samsung Display Co., Ltd., Yongin-Si (KR)

(72) Inventors: Gee Bum Kim, Yongin-si (KR); Kwang Soo Bae, Yongin-si (KR); Bo Kwang Song, Yongin-si (KR); Byung Han Yoo, Yongin-si (KR); Dae Young Lee, Yongin-si (KR); Min Oh Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 564 days.

(21) Appl. No.: 17/873,409

(22) Filed: Jul. 26, 2022

(65) Prior Publication Data

US 2023/0122736 A1    Apr. 20, 2023

(30) Foreign Application Priority Data

Oct. 18, 2021    (KR) .......................... 10-2021-0138750

(51) Int. Cl.
*H10K 50/86*    (2023.01)
*H10K 50/84*    (2023.01)
*H10K 50/858*    (2023.01)
*H10K 59/38*    (2023.01)

(52) U.S. Cl.
CPC ........... *H10K 50/865* (2023.02); *H10K 50/84* (2023.02); *H10K 50/858* (2023.02); *H10K 59/38* (2023.02)

(58) Field of Classification Search
None
See application file for complete search history.

(56) References Cited

U.S. PATENT DOCUMENTS

| 11,005,076 | B2 | 5/2021 | Lee |
| 11,101,314 | B2 | 8/2021 | Lee et al. |
| 11,121,196 | B2 | 9/2021 | Lee et al. |
| 2020/0144550 | A1* | 5/2020 | Lee ........................ H10K 50/858 |
| 2022/0067340 | A1* | 3/2022 | Han ......................... H10K 59/38 |

(Continued)

FOREIGN PATENT DOCUMENTS

| KR | 10-2020-0051883 A | 5/2020 |
| KR | 10-2020-0077953 A | 7/2020 |

(Continued)

*Primary Examiner* — Nduka E Ojeh
(74) *Attorney, Agent, or Firm* — Innovation Counsel LLP

(57) ABSTRACT

A display device according to embodiments of the disclosure includes a base layer, a pixel layer disposed on the base layer and including a light emitting element and a light receiving element, an encapsulation layer covering the pixel layer, a black matrix disposed on the encapsulation layer and including a first opening disposed in a region corresponding to the light receiving element and a second opening disposed in a region corresponding to the light emitting element, a color filter disposed on the black matrix, a refractive layer disposed on the color filter and including a first refractive layer including a third opening disposed in a region corresponding to the first opening and a second refractive layer covering the first refractive layer, and a window disposed on the refractive layer. A cross section of the third opening has a first inclined surface.

20 Claims, 11 Drawing Sheets

(56) References Cited

U.S. PATENT DOCUMENTS

| | | | | |
|---|---|---|---|---|
| 2022/0351538 A1* | 11/2022 | Tago | ................. | H10F 39/198 |
| 2023/0157123 A1* | 5/2023 | Kubota | ................. | H05B 33/28 |
| | | | | 257/40 |
| 2023/0276647 A1* | 8/2023 | Kawano | ............... | H10K 50/156 |
| | | | | 257/40 |

FOREIGN PATENT DOCUMENTS

| | | | |
|---|---|---|---|
| KR | 10-2020-0078796 A | | 7/2020 |
| KR | 10-2020-0080484 A | | 7/2020 |
| WO | 2020165686 A1 | | 8/2020 |

* cited by examiner

DISPLAY DEVICE INCLUDING A PHOTO SENSOR

CROSS-REFERENCE TO RELATED APPLICATION

This application claims priority under 35 U.S.C. § 119 to Korean Patent Application No. 10-2021-0138750, filed in the Korean Intellectual Property Office on Oct. 18, 2021, the disclosure of which is incorporated by reference in its entirety.

TECHNICAL FIELD

The disclosure relates to a display device including a photo sensor.

DISCUSSION OF THE RELATED ART

As information society develops, demand for a display device for displaying an image is increasing in various forms. For example, the display device is applied to various electronic devices such as a smart phone, a digital camera, a notebook computer, a navigation system, and a smart television.

Recently, research and development on a technology for combining and integrating a fingerprint sensor for recognizing a fingerprint or the like in a display panel occupying a majority area in the display device are being conducted.

Meanwhile, the display device may include a cover window on the display panel to protect the display device from external impact. When a thickness of the cover window increases, a fingerprint acquisition area (or a sensing area) that the fingerprint sensor may obtain may also increase. In order for the fingerprint sensor to distinguish a ridge and a valley of the fingerprint, it is preferable that the fingerprint acquisition area (or the sensing area) of the fingerprint sensor is less than a period of the fingerprint. That is, when the fingerprint acquisition area (or the sensing area) of the fingerprint sensor increases, fingerprint sensing resolution may decrease.

SUMMARY

A technical object to be solved is to provide a display device capable of reducing a fingerprint acquisition area (or a sensing area) increased due to a cover window.

However, an object of the disclosure is not limited to the above-described objects, and may be variously expanded without departing from the spirit and scope of the disclosure.

In order to achieve an object of the disclosure, according to embodiments of the disclosure, a display device includes a base layer, a pixel layer disposed on the base layer and including a light emitting element and a light receiving element, an encapsulation layer covering the pixel layer, a black matrix disposed on the encapsulation layer and including a first opening disposed in a region corresponding to the light receiving element and a second opening disposed in a region corresponding to the light emitting element, a color filter disposed on the black matrix, a refractive layer disposed on the color filter and including a first refractive layer including a third opening disposed in a region corresponding to the first opening and a second refractive layer covering the first refractive layer, and a window disposed on the refractive layer. A cross section of the third opening has a first inclined surface.

The first inclined surface may have a first inclination angle for totally reflecting light reflected from an object that is in contact with the window.

Some of the reflected light reflected by the first inclined surface may be incident outside a light receiving area of the light receiving element.

The first inclination angle may be greater than 0° and less than or equal to 57.2°.

The first inclined surface may have a second inclination angle for refracting light reflected from an object that is in contact with the window.

Some of the reflected light refracted by the first inclined surface may be incident outside a light receiving area of the light receiving element.

The second inclination angle may be greater than 57.2° and less than 90°.

A refractive index of the first refractive layer may be less than a refractive index of the second refractive layer.

A width of a sensing area of the light receiving element may be calculated by Equation 1 below, $$S = P + L1/L2(P + S0) \quad \text{[Equation 1]}$$

where S is the sensing area, P is a width of the first opening, L1 is a vertical distance from a lower surface of the black matrix to an upper surface of the window, L2 is a vertical distance from the lower surface of the black matrix to an upper surface of the light receiving element, and S0 is a width of the light receiving element.

The width of the sensing area may decrease as an inclination angle of the first inclined surface increases.

The width of the sensing area may having a second inclination angle for refracting the reflected light may be less than that having a first inclination angle for totally reflecting the reflected light reflected from an object that is in contact with the window.

When a thickness of the first refractive layer increases between 0 and a preset value, the width of the sensing area may decreases.

The thickness of the second refractive layer may be greater than 0 μm and less than or equal to 6 μm.

The display device may further include a touch sensor layer disposed between the encapsulation layer and the black matrix.

The first refractive layer may include a fourth opening disposed in a region corresponding to the second opening and a cross section of the fourth opening may have a second inclined surface.

The second inclined surface may have a third inclination angle for totally reflecting emitted light emitted from the light emitting element or a fourth inclination angle for refracting the emitted light.

The third inclination angle may be greater than 0° and less than or equal to 57.2°, and the fourth inclination angle may be greater than 57.2° and less than 90°.

An inclination angle of the first inclined surface and an inclination angle of the second inclined surface may be different.

In a thickness of the first refractive layer, a thickness of an area corresponding to the third opening and a thickness of an area corresponding to the fourth opening may be different.

A width of the third opening may be less than a width of the fourth opening.

A display device according to an embodiment of the disclosure may further include a refractive layer disposed between a display panel and a cover glass, thereby reducing a fingerprint acquisition area increased due to the cover glass.

A display device according to the embodiment may further include a refractive layer disposed between a display panel and a cover glass, thereby increasing front surface light efficiency of light emitted from the light emitting element.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detailed embodiments thereof with reference to the accompanying drawings, in which.

DETAILED DESCRIPTION OF THE EMBODIMENT

Figure 1:
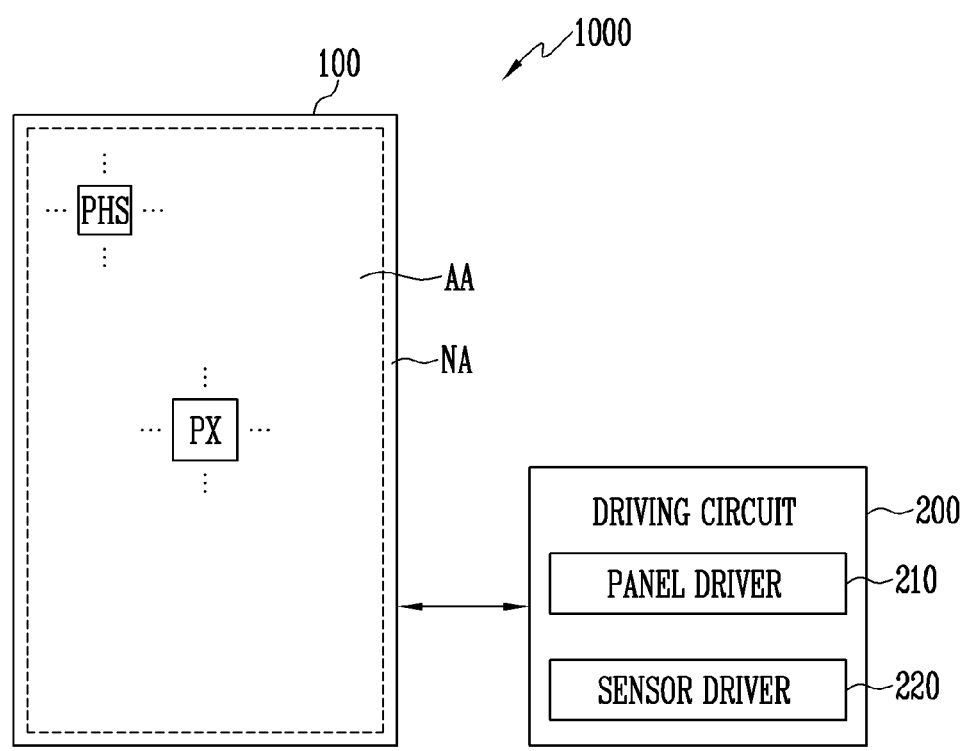
FIG. 1 is a block diagram illustrating a display device according to embodiments of the disclosure.

Hereinafter, embodiments of the disclosure is described in more detail with reference to the accompanying drawings. The same reference numerals are used for the same components in the drawings and a repeated description of the same component is omitted.

FIG. 1 is a block diagram illustrating a display device according to embodiments of the disclosure.

Referring to FIG. 1, the display device 1000 may include a display panel 100 and a driving circuit 200. In an embodiment, the driving circuit 200 may include a panel driver 210 and a sensor driver 220.

The display device 1000 may be implemented as a self-emission display device including a plurality of self-emission elements. In particular, the display device 1000 may be an organic light emitting display device including organic light emitting elements. However, this is an example and the display device 1000 may be implemented as a display device including inorganic light emitting elements or a display device including light emitting elements configured of an inorganic material and an organic material in complex. Alternatively, the display device 1000 may be implemented as a liquid crystal display device, a plasma display device, a quantum dot display device, or the like.

The display device 1000 may be a flat display device, a flexible display device, a curved display device, a foldable display device, or a bendable display device. In addition, the display device may be applied to a transparent display device, a head-mounted display device, a wearable display device, or the like.

The display panel 100 includes a display area AA and a non-display area NA. The display area AA may be an area in which a plurality of pixels PX are provided. Each of the pixels PX may include at least one light emitting element. For example, the light emitting element may include a light emitting layer (or an organic light emitting layer). A portion emitting light by the light emitting element may be defined as a light emitting area. The display device 1000 may display an image in the display area AA by driving the pixels PX in response to externally input image data.

In an embodiment, a photo sensor PHS (or may be referred to as a sensor pixel) may be included in the display area AA. The photo sensor PHS may include a light receiving element including a light receiving layer. In the display area AA, the light receiving layer of the light receiving element may be disposed to be spaced apart from the light emitting layer of the light emitting element.

In an embodiment, a plurality of photo sensors PHS may be distributed to be spaced apart from each other over the entire area of the display area AA. However, this is an example, and only a portion of the display area AA may be set as a predetermined sensing area and the photo sensors PHS may be provided in an area corresponding to the predetermined sensing area. In addition, the photo sensor PHS may also be included in at least a portion of the non-display area NA.

In an embodiment, the photo sensors PHS may sense light emitted from a light source (for example, the light emitting element) and reflected by an external object (for example, a user's finger or the like). For example, a user's fingerprint may be sensed through the photo sensor PHS. Hereinafter, the photo sensors PHS for fingerprint sensing is illustrated as the photo sensors PHS, but in various embodiments, the photo sensors PHS may sense various biometric information such as an iris and a vein. In addition, the photo sensor PHS may sense external light and may also perform a function of a gesture sensor, a motion sensor, a proximity sensor, an illuminance sensor, an image sensor, or the like.

The non-display area NA may be an area provided around the display area AA. In an embodiment, the non-display area NA may mean an area except for the display area AA on the display panel 100. For example, the non-display area NA may include a line area, a pad area, various dummy areas, and the like.

The display device 1000 may include the driving circuit 200 which includes the panel driver 210 and the sensor driver 220. In FIG. 1, the panel driver 210 and the sensor driver 220 are separately provided, but the technical spirit of the disclosure is not limited thereto. For example, at least a portion of the sensor driver 220 may be included in the panel driver 210 or may operate in conjunction with the panel driver 210.

The panel driver 210 may scan the pixels PX of the display area AA and supply a data signal corresponding to image data (or an image) to the pixels PX. The display panel 100 may display an image corresponding to the data signal.

In an embodiment, the panel driver 210 may supply a driving signal for fingerprint sensing to the pixels PX. Such a driving signal may be provided so that the pixels PX emit light to operate as a light source for the photo sensor PHS. In an embodiment, the panel driver 210 may also supply the driving signal and/or another driving signal for the fingerprint sensing to the photo sensor PHS. However, this is an example, and the driving signals for the fingerprint sensing may be provided by the sensor driver 220.

The sensor driver 220 may detect biometric information such as a user's fingerprint based on a sensing signal received from the photo sensors PHS. In an embodiment, the sensor driver 220 may also supply the driving signals to the photo sensor PHS and/or the pixel PX.

Figure 2:
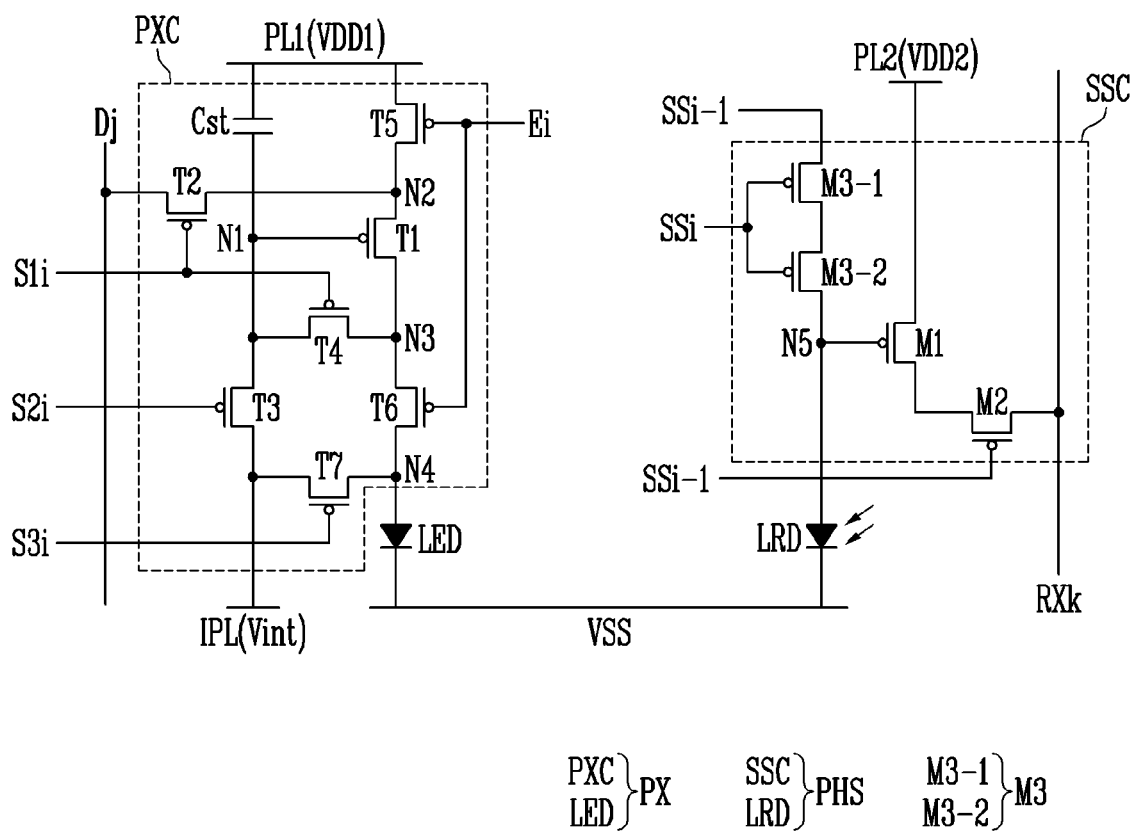
FIG. 2 is a circuit diagram illustrating an example of a pixel and a photo sensor included in the display device of FIG. 1.

FIG. 2 is a circuit diagram illustrating an example of a pixel and a photo sensor included in the display device of FIG. 1.

In FIG. 2, for convenience of description, a pixel PX positioned in an i-th pixel row (or an i-th horizontal line) and connected to a j-th data line Dj, and a photo sensor PHS positioned in the i-th pixel row and connected to a k-th readout line is shown (where i, j, and k are natural numbers).

Referring to FIGS. 1 and 2, the pixel PX may include a pixel circuit PXC and a light emitting element connected thereto, and the photo sensor PHS may include a sensor circuit SSC and a light receiving element LRD connected thereto.

A first electrode (or a first pixel electrode) of the light emitting element LED may be connected to a fourth node N4, and a second electrode (or a second pixel electrode) may be connected to second power VSS. The light emitting element LED may generate light of a predetermined luminance in response to an amount of current (driving current) supplied from a first pixel transistor T1.

In an embodiment, the light emitting element LED may be an organic light emitting diode including an organic light emitting layer. In another embodiment, the light emitting element LED may be an inorganic light emitting element formed of an inorganic material. In another embodiment, the light emitting element LED may be a light emitting element which includes an inorganic material and an organic material.

A first electrode (or a first sensor electrode) of the light receiving element LRD may be connected to a fifth node N5, and a second electrode (or a second sensor electrode) may be connected to the second power VSS. The light receiving element LRD may generate carriers including free electrons and holes based on intensity of light incident onto the light receiving layer, and may generate a current (photocurrent) by movement of the carrier.

The pixel circuit PXC may include the first pixel transistor T1, a second pixel transistor T2, a storage capacitor Cst, and the light emitting element LED. In an embodiment, the pixel circuit PXC may further include third to seventh pixel transistors T3 to T7.

The first pixel transistor T1 (or a driving transistor) may be connected between a driving power line PL1 to which a voltage of driving power VDD1 (or first power) is applied and a first electrode of the light emitting element LED. The first pixel transistor T1 may include a gate electrode connected to a first node N1, a first electrode connected to a second node N2, and a second electrode connected to a third node N3.

The first pixel transistor T1 may control the amount of current (driving current) flowing from the driving power VDD1 to the second power VSS via the light emitting element LED based on a voltage of the first node N1. To this end, the driving power VDD1 may be set to a voltage higher than that of the second power VSS.

The second pixel transistor T2 may be connected between the j-th data line Dj (hereinafter, referred to as a data line) and the second node N2. A gate electrode of the second pixel transistor T2 may be connected to an i-th first scan line S1*i* (hereinafter, referred to as a first scan line). The second pixel transistor T2 may be turned on when a first scan signal is supplied to the first scan line S1*i* to electrically connect the data line Dj and the second node N2.

The third pixel transistor T3 may be connected between the first node N1 and an initialization power line IPL transmitting a voltage of initialization power Vint. A gate electrode of the third pixel transistor T3 may be connected to an i-th second scan line S2*i* (hereinafter, referred to as a second scan line). The third pixel transistor T3 may be turned on by a second scan signal supplied to the second scan line S2*i*. When the third pixel transistor T3 is turned on, the voltage of the initialization power Vint may be supplied to the first node N1 (that is, the gate electrode of the first pixel transistor T1). In an embodiment, a timing of the second scan signal supplied to the second scan line S2*i* may be the same as a timing of a scan signal supplied to an (i–1)-th first scan line (for example, referred to as S1*i*–1).

The fourth pixel transistor T4 may be connected between the first node N1 and the third node N3. A gate electrode of the fourth pixel transistor T4 may be connected to the first scan line S1*i*. The fourth pixel transistor T4 may be turned on simultaneously with the second pixel transistor T2.

The fifth pixel transistor T5 may be connected between the driving power line PL1 and the second node N2. A gate electrode of the fifth pixel transistor T5 may be connected to an i-th emission control line Ei (hereinafter, referred to as an emission control line). The sixth pixel transistor T6 may be connected between the third node N3 and the light emitting element LED (or the fourth node N4). A gate electrode of the sixth pixel transistor T6 may be connected to the emission control line Ei. The fifth pixel transistor T5 and the sixth pixel transistor T6 may be turned off when an emission control signal is supplied to the emission control line Ei, and may be turned on in other cases.

According to an embodiment, when the fifth and sixth pixel transistors T5 and T6 are turned on, a current flowing through the first pixel transistor T1 may be provided to the light emitting element LED and the light emitting element LED may emit light.

The seventh pixel transistor T7 may be connected between the first electrode (that is, the fourth node N4) of the light emitting element LED and the initialization power line IPL. A gate electrode of the seventh pixel transistor T7 may be connected to an i-th third scan line S3*i* (hereinafter, referred to as a third scan line). The seventh pixel transistor T7 may be turned on by a third scan signal supplied to the third scan line S3*i* to supply the voltage of the initialization power Vint to the first electrode of the light emitting element LED. In an embodiment, a timing of the third scan signal supplied to the third scan line S3*i* may be the same as a timing of one among scan signals supplied to the first scan line S1*i*, the (i–1)-th first scan line S1*i*–1, and an (i+1)-th first scan line (for example, S1*i*+1).

The storage capacitor Cst may be connected between the driving power line PL1 and the first node N1.

In an embodiment, the first scan signal may be supplied after the second scan signal is supplied. For example, after the second scan signal is supplied during one horizontal period, the first scan signal may be supplied during a next horizontal period which follows the one horizontal period.

In an embodiment, the third scan signal may be supplied simultaneously with the first scan signal. However, this is an example, and the first scan signal may be supplied after the third scan signal is supplied. For example, the third scan signal and the first scan signal may be supplied during one horizontal period. Alternatively, the third scan signal may be supplied after the first scan signal is supplied.

The sensor circuit SSC may include a first sensor transistor M1, a second sensor transistor M2, and a third sensor transistor M3.

The first sensor transistor M1 and the second sensor transistor M2 may be connected in series between a sensing power line PL2 and the k-th readout line RXk (hereinafter, referred to as a readout line). Sensing power VDD2 may be supplied to the sensing power line PL2. For example, a voltage of the sensing power VDD2 may be different from the voltage of the driving power VDD1. However, this is an example, and the voltages of the sensing power VDD2 and the driving power VDD1 may be the same.

A gate electrode of the first sensor transistor M1 may be connected to a fifth node N5 (or the first electrode (the first sensor electrode) of the light receiving element LRD). The first sensor transistor M1 may generate a sensing current flowing from the sensing power line PL2 to the readout line RXk based on a voltage of the fifth node N5 which is altered by the photocurrent generated by the light receiving element LRD.

In an embodiment, a gate electrode of the second sensor transistor M2 may be connected to an (i−1)-th sensing scan line SSi−1 (hereinafter, referred to as a previous sensing scan line). The second sensor transistor M2 may be turned on when a sensing scan signal is supplied to the previous sensing scan line SSi−1 to electrically connect the first sensor transistor M1 and the readout line RXk. Then, a sensing signal (a sensing current) may be supplied to the sensor driver 220 through the readout line RXk.

The third sensor transistor M3 may be connected between the previous sensing scan line SSi−1 and the fifth node N5. A gate electrode of the third sensor transistor M3 may be connected to an i-th sensing scan line SSi (hereinafter, referred to as a sensing scan line). The third sensor transistor M3 may be turned on by a sensing scan signal supplied to the i-th sensing scan line SSi to supply a voltage supplied to the previous sensing scan line SSi−1 to the fifth node N5. The third sensor transistor M3 may be used to reset (or initialize) a voltage of the fifth node N5.

In an embodiment, the third sensor transistor M3 may include a plurality of sub-transistors M3−1 and M3−2 connected in series.

In an embodiment, a timing of the sensing scan signal supplied to the sensing scan line SSi may be different from supply timings of the scan signals supplied to the first to third scan lines S1i, S2i, and S3i. However, this is an example, and the sensing scan signal supplied to the sensing scan line SSi may be supplied at the same time as one of the scan signals supplied to the first to third scan lines S1i, S2i, and S3i.

The pixel transistors T1 to T7 and the sensor transistors M1 to M3 may be P-type transistors (for example, PMOS transistors), but the type of the pixel transistors T1 to T7 and the sensor transistors M1 to M3 are not limited thereto. For example, at least one of the pixel transistors T1 to T7 and the sensor transistors M1 to M3 may be implemented as an N-type transistor (for example, an NMOS). When the pixel transistors T1 to T7 and the sensor transistors M1 to M3 are N-type transistors, positions of a source region (source electrode) and a drain region (drain electrode) may be reversed.

Figure 3:
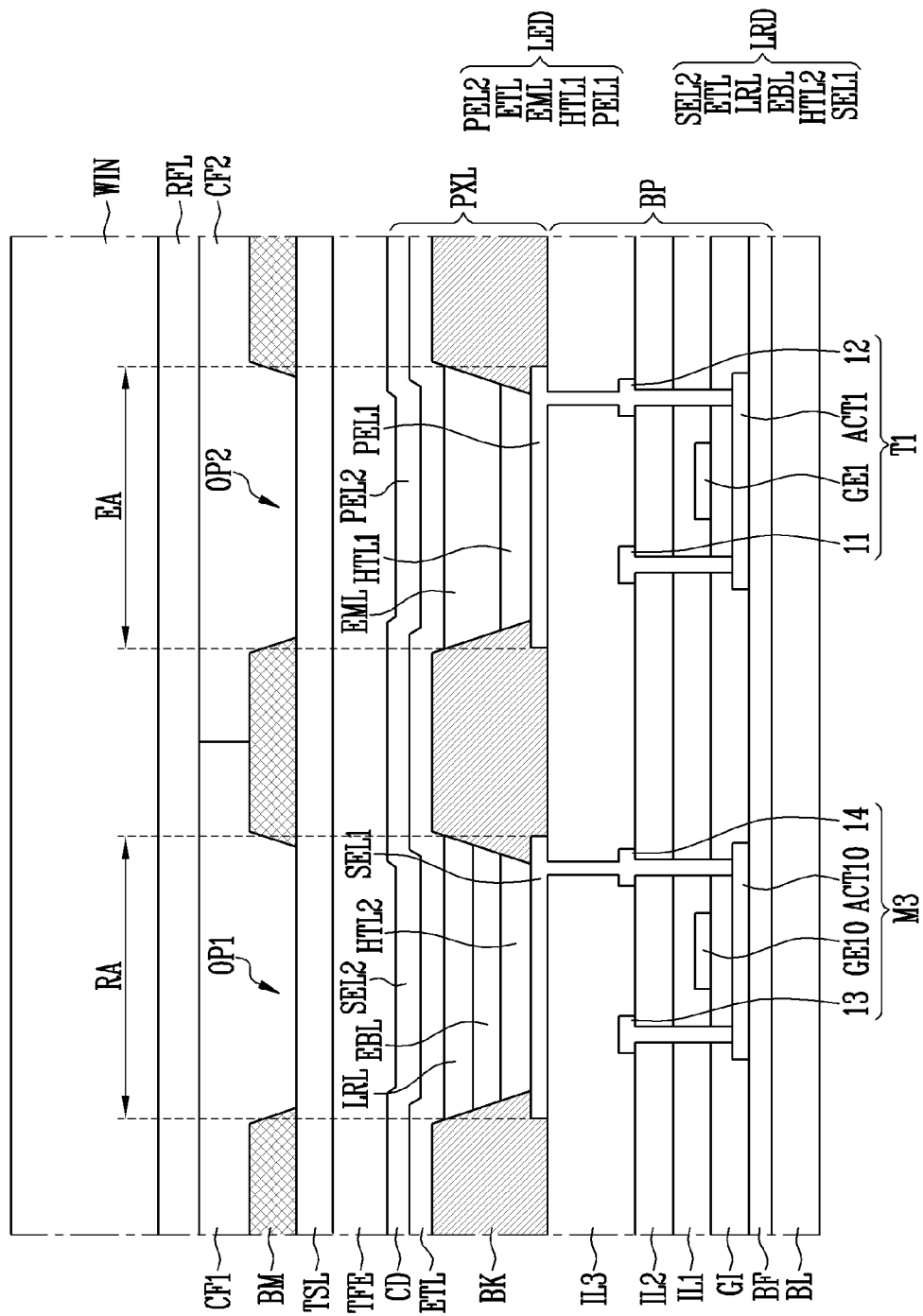
FIG. 3 is a cross-sectional view illustrating an example of a display area of FIG. 1.

FIG. 3 is a cross-sectional view illustrating an example of the display area of FIG. 1.

Referring to FIGS. 1 to 3, the display device 1000 (or the display panel 100) may include a base layer BL, a backplane structure BP, a pixel layer PXL, and an encapsulation layer TFE. The display panel 100 may further include a touch sensor layer TSL, a black matrix BM, color filters CF1 and CF2, a refractive layer RFL, and a window WIN. The black matrix BM may include openings for transmitting light to the light receiving element LRD.

The cross-sectional view of FIG. 3 shows a partial configuration of the pixel PX and the photo sensor PHS. In FIG. 3, the disclosure is described based on a configuration of the first pixel transistor T1 and the third sensor transistor M3. In FIG. 3, for convenience of description, the first pixel transistor T1 is directly connected to the light emitting element LED. The first pixel transistor T1 may include a first active pattern ACT1, a first gate electrode GE1, a first source electrode 11, and a first drain electrode 12. The third sensor transistor M3 may include a tenth active pattern ACT10, a tenth gate electrode GE10, a tenth source electrode 13, and a tenth drain electrode 14.

The base layer BL may be formed of an insulating material such as glass or resin. In addition, the base layer BL may be formed of a material having flexibility to be bent or folded, and may have a single layer structure or a multi-layer structure.

The backplane structure BP including the pixel circuit PXC and the sensor circuit SSC may be provided on the base layer BL. The backplane structure BP may include a buffer layer BF, semiconductor layers ACT1 and ACT10, conductive layers GE1, GE10, 11, 12, 13 and 14, and insulating layers GI, IL1, IL2 and IL3.

The buffer layer BF may be formed on the base layer BL. The buffer layer BF may prevent an impurity from diffusing into the transistors T1 and M3. The buffer layer BF may be omitted according to a material and a process condition of the base layer BL.

A semiconductor layer including the first active pattern ACT1 and the tenth active pattern ACT10 is provided on the buffer layer BF. In an embodiment, the semiconductor layer may include a polysilicon semiconductor. For example, the semiconductor layer may be formed through a low-temperature poly-silicon process. However, this is an example, and at least a portion of the semiconductor layer may be formed of an oxide semiconductor, a metal oxide semiconductor, or the like.

A gate insulating layer GI may be provided on the semiconductor layer. The gate insulating layer GI may be an inorganic insulating layer formed of an inorganic material.

A first conductive layer including the first gate electrode GE1 and the tenth gate electrode GE10 may be provided on the gate insulating layer GI. The first gate electrode GE1 may cover a region corresponding to a channel region of the first active pattern ACT1. The tenth gate electrode GE10 may cover a region corresponding to the channel region of the tenth active pattern ACT10.

The first conductive layer including the first gate electrode GE1 and the tenth gate electrode GE10 may be formed of a metal. For example, the first conductive layer may be formed of at least one of a metal such as gold (Au), silver (Ag), aluminum (Al), molybdenum (Mo), chromium (Cr), titanium (Ti), nickel (Ni), neodymium (Nd), and copper (Cu), or an alloy of metals. In addition, the first conductive layer may be formed as a single layer or a multilayer in which two or more metals and metal alloys are stacked.

A first insulating layer IL1 (or a first interlayer insulating layer) may be provided on the first conductive layer. The first insulating layer IL1 may be an inorganic insulating layer formed of an inorganic material. As the inorganic material, polysiloxane, silicon nitride, silicon oxide, silicon oxynitride, or the like may be used.

A second conductive layer (not shown) may be provided on the first insulating layer IL1. In an embodiment, the second conductive layer may include a readout line RXk, an initialization power line IPL, and a sensing power line PL2. The second conductive layer may be formed of at least one of a metal such as gold (Au), silver (Ag), aluminum (Al), molybdenum (Mo), chromium (Cr), titanium (Ti), nickel (Ni), neodymium (Nd), and copper (Cu), or an alloy of metals. In addition, the second conductive layer may be formed as a single layer, but the configuration of the second conductive layer is not limited thereto, and may be formed as a multilayer in which two or more materials among metals and alloys are stacked.

A second insulating layer IL2 (or a second interlayer insulating layer) may be provided on the second conductive layer. The second insulating layer IL2 may be an inorganic insulating layer formed of an inorganic material. As the inorganic material, polysiloxane, silicon nitride, silicon oxide, silicon oxynitride, or the like may be used.

A third conductive layer including the first source electrode 11, the first drain electrode 12, the tenth source electrode 13, and the tenth drain electrode 14 may be provided on the second insulating layer IL2. In FIG. 3, it is assumed that the first pixel transistor T1 and the third sensor transistor M3 are P-type transistors, but the source electrode and the drain electrode may vary according to a type or the like of the transistor.

The first source electrode 11 and the first drain electrode 12 may contact a source region and a drain region of the first active pattern ACT1, respectively, through a contact hole formed in the gate insulating layer GI, the first insulating layer IL1, and the second insulating layer IL2.

The tenth source electrode 13 and the tenth drain electrode 14 may contact a source region and a drain region of the tenth active pattern ACT2, respectively, through a contact hole formed in the gate insulating layer GI, the first insulating layer IL1, and the second insulating layer IL2.

The third conductive layer including the source electrodes 11 and 13 and the drain electrodes 12 and 14 may be formed of a metal. For example, the third conductive layer may be formed of at least one of a metal such as gold (Au), silver (Ag), aluminum (Al), molybdenum (Mo), chromium (Cr), titanium (Ti), nickel (Ni), neodymium (Nd), and copper (Cu), or an alloy of metals.

In an embodiment, a passivation layer (not shown) may be provided on the third conductive layer. The passivation layer may be an inorganic insulating layer formed of an inorganic material. As the inorganic material, polysiloxane, silicon nitride, silicon oxide, silicon oxynitride, or the like may be used.

A third insulating layer IL3 may be provided on the third conductive layer (or the passivation layer). In an embodiment, the third insulating layer IL3 may be an organic insulating layer formed of an organic material. As the organic material, an organic insulating material such as a polyacrylic compound, a polyimide compound, a fluorine-based carbon compound such as Teflon, or a benzocyclobutene compound may be used. Alternatively, the third insulating layer IL3 may be an inorganic insulating layer formed of an inorganic material.

In FIG. 3, the third insulating layer IL3 is provided on the second insulating layer IL2, but a disposition of the insulating layer may vary. For example, only the passivation layer may be provided on the source and drain electrodes 11, 12, 13, and 14, and a first pixel electrode PEL1 and a first sensor electrode SEL1 may be provided on the passivation layer. Alternatively, an additional conductive layer and a fourth insulating layer covering the additional conductive layer may be provided, and the first pixel electrode PEL1 and the first sensor electrode SEL1 may be provided on the fourth insulating layer.

A pixel layer PXL may be provided on the backplane structure BP. The pixel layer PXL may include the light emitting element LED connected to the pixel circuit PXC and the light receiving element LRD connected to the sensor circuit SSC.

In an embodiment, the light emitting element LED may include a first pixel electrode PEL1, a first hole transport layer HTL1, a light emitting layer EML, an electron transport layer ETL, and a second pixel electrode PEL2. In an embodiment, the light receiving element LRD may include a first sensor electrode SEL1, a second hole transport layer HTL2, an electron blocking layer EBL, a light receiving layer LRL, an electron transport layer ETL, and a second sensor electrode SEL2.

In an embodiment, the first pixel electrode PEL1 and the first sensor electrode SEL1 may be formed of a metal layer such as Ag, Mg, Al, Pt, Pd, Au, Ni, Nd, Ir, Cr, or an alloy thereof and/or indium tin oxide (ITO), indium zinc oxide (IZO), zinc oxide (ZnO), indium tin zinc oxide (ITZO), or the like. The first pixel electrode PEL1 may be connected to the first drain electrode 12 through a contact hole. The first sensor electrode SEL1 may be connected to the tenth drain electrode 14 through a contact hole.

The first pixel electrode PEL1 and the first sensor electrode SEL1 may be simultaneously formed through patterning using a mask.

On the third insulating layer IL3 on which the first pixel electrode PEL1 and the first sensor electrode SEL1 are formed, a bank layer BK (or a pixel defining layer) that partitions a light emitting area EA and a light receiving area RA may be provided. A portion where light is received by the light receiving element LRD may be defined as the light receiving area RA.

The bank layer BK may be an organic insulating layer formed of an organic material. The organic material may include an acryl resin, an epoxy resin, a phenolic resin, a polyamide resin, a polyimide resin, and the like.

In addition, the bank layer BK may include a light absorbing material or a light absorbing agent which may absorb light introduced from the outside. For example, the bank layer BK may include a carbon-based black pigment. However, the disclosure is not limited thereto, and the bank layer BK may include chromium (Cr) having high light absorption, molybdenum (Mo), an alloy of molybdenum and titanium (MoTi), tungsten (W), vanadium (V), niobium (Nb), tantalum (Ta), manganese (Mn), cobalt (Co), or an opaque metal material such as nickel (Ni).

The bank layer BK may expose an upper surface of the first pixel electrode PEL1 and an upper surface of the first sensor electrode SEL1, and may be protruded from the third insulating layer IL3 along a perimeter of the light emitting area EA and a perimeter of the light receiving area RA. That is, the bank layer BK may include openings in regions corresponding to the light emitting area EA and the light receiving area RA.

The first hole transport layer HTL1 may be provided on the upper surface of the first pixel electrode PEL1 exposed by the bank layer BK, and the second hole transport layer HTL2 may be provided on the exposed upper surface of the first sensor electrode SEL1. A hole may move to the light emitting layer EML through the first hole transport layer HTL1 and a hole may move to the light receiving layer LRL through the second hole transport layer HTL2.

In an embodiment, the first hole transport layer HTL1 and the second hole transport layer HTL2 may be formed of the same material or different materials depending on a material of the light emitting layer EML and the light receiving layer LRL.

The light emitting layer EML may be provided on the first hole transport layer HTL1 in the light emitting area EA surrounded by the bank layer BK. In an embodiment, the light emitting layer EML may be formed of an organic light emitting layer. According to an organic material included in the light emitting layer EML, the light emitting layer EML may emit light of red light, green light, blue light, or the like.

In an embodiment, as shown in FIG. 3, an electron blocking layer EBL may be provided on the second hole transport layer HTL2 in the light receiving area RA surrounded by the bank layer BK. The electron blocking layer EBL may prevent a charge of the light receiving layer LRL from being moved to the hole transport layer HTL. In an embodiment, the electron blocking layer EBL may include the same material as the first hole transport layer HTL1 of the light emitting area.

In an embodiment, the electron blocking layer EBL may be omitted.

The light receiving layer LRL may be disposed on the electron blocking layer EBL or the second hole transport layer HTL2. The light receiving layer LRL may sense intensity of light by emitting an electron in response to light of a specific wavelength band.

In an embodiment, the light receiving layer LRL may include a low molecular organic material. For example, the light receiving layer LRL is formed of a phthalocyanine compound including at least one or more metals selected from a group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular organic material included in the light receiving layer LRL may be configured as a bi-layer including a layer including a phthalocyanine compound including at least one or more metals selected from a group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including C60, of may be configured as a single mixing layer in which a phthalocyanine compound and C60 are mixed.

However, this is an example and the light receiving layer LRL may include a polymer organic layer.

Meanwhile, in FIG. 3, for convenience of description, the area of the light receiving area RA and the area of the light emitting area EA are similar, the area of the light receiving area RA may be less than the area of the light emitting area EA. Therefore, presence of the light receiving area RA may not significantly affect light emission of the pixel PX for displaying an image, and image quality equal to or greater than a certain level may be guaranteed.

In an embodiment, the electron transport layer ETL may be provided on the light emitting layer EML and the light receiving layer LRL. The electron transport layer ETL may be integrally formed on the display area AA. Therefore, the electron transport layer ETL may contact an upper surface of the bank layer BK.

However, this is an example, and at least one of the first hole transport layer HTL1, the second hole transport layer HTL2, the electron blocking layer EBL, and the electron transport layer ETL may be omitted. In addition, a functional layer such as a hole injection layer and an electron injection layer may be added.

The second pixel electrode PEL2 may be provided on the electron transport layer ETL of the light emitting area EA, and the second sensor electrode SEL2 may be provided on the electron transport layer ETL of the light receiving area RA. In an embodiment, the second pixel electrode PEL2 and the second sensor electrode SEL2 may be a common electrode CD integrally formed on the display area AA. A voltage of the second power VSS may be supplied to the second pixel electrode PEL2 and the second sensor electrode SEL2.

The second pixel electrode PEL2 and the second sensor electrode SEL2 may be formed of a metal layer such as Ag, Mg, Al, Pt, Pd, Au, Ni, Nd, Ir, and Cr and/or a transparent conductive layer such as ITO, IZO, ZnO, and ITZO. In an embodiment, the common electrode CD may be formed of a multi-layer of a double layer or more including a thin metal layer, for example, a triple layer of ITO/Ag/ITO.

The encapsulation layer TFE may be provided on the common electrode CD including the second pixel electrode PEL2 and the second sensor electrode SEL2. The encapsulation layer TFE may be formed of a single layer, but may be formed of a multilayer. In an embodiment, the encapsulation layer TFE may have a stack structure in which an inorganic material, an organic material, and an inorganic material are sequentially deposited. The uppermost layer of the encapsulation layer TFE may be formed of an inorganic material.

In an embodiment, the touch sensor layer TSL may be disposed on the encapsulation layer TFE. The touch sensor layer TSL may include a conductive pattern and an insulating layer for touch sensing. The conductive pattern of the touch sensor layer TSL may be formed of a single layer or a double layer formed with an insulating layer interposed therebetween.

In an embodiment, the conductive pattern of the touch sensor layer TSL may be disposed on an area other than the light emitting area EA and the light receiving area RA in order to secure image quality and light reception amount.

The black matrix BM may be provided on the encapsulation layer TFE or the touch sensor layer TSL. The black matrix BM may absorb or block light introduced from the outside. The black matrix BM may include an organic light blocking material. For example, the organic light blocking material may include at least one of carbon black and titanium black, but the material forming the organic light blocking material is not limited thereto.

The black matrix BM may include a plurality of openings OP1 and OP2. In an embodiment, the black matrix BM may be formed by a patterning process using a mask, a printing process, or the like.

In an embodiment, the black matrix BM may be provided to overlap the bank layer BK. In addition, the black matrix BM may be disposed to cover conductive patterns of the touch sensor layer TSL. The black matrix BM is disposed not to overlap the light emitting area EA. For example, the black matrix BM may include the second opening OP2 overlapping the light emitting area EA.

The first opening OP1 of the black matrix BM may overlap the light receiving area RA. The first opening OP1 of the black matrix BM may provide an optical path through which external light is incident onto the light receiving layer LRL.

For example, a vertical light component of the external light may be transmitted to the light receiving layer LRL through the first opening OP1. A phase of an image formed on the light receiving layer LRL through the first opening OP1 may be reversed by 180 degrees from the external light. However, this is an example, and a function of an optical system of the first opening OP1 may be determined by a width of the first opening OP1, a thickness of the black matrix BM, a distance between the black matrix BM and the light receiving layer LRL, a distance between the black matrix BM and an upper structure (the window WIN), and the like.

In an embodiment, the color filters CF1 and CF2 may be disposed on the touch sensor layer TSL and the black matrix BM. A second color filter CF2 may be one of a red color filter, a green color filter, and a blue color filter according to a color of light emitted from the light emitting area EA. For example, when green light is output from the light emitting area EA, the second color filter CF2 may be the green color filter.

In an embodiment, the color filters CF1 and CF2 may directly contact at least a portion of an upper surface and a side surface of the black matrix BM. For example, the color filters CF1 and CF2 may be directly disposed on the black matrix BM. Alternatively, a material except for a bonding member for bonding the color filters CF1 and CF2 and the black matrix BM is not interposed between the color filters CF1 and CF2 and the black matrix BM.

The second color filter CF2 may selectively transmit light emitted from the light emitting element LED according to a wavelength or a color. When the black matrix BM and the color filters CF1 and CF2 are disposed on the touch sensor layer TSL, external light reflection may be sufficiently prevented without a polarization layer having a thickness of generally 80 μm or more. In addition, since the color filters CF1 and CF2 has a transmittance higher than that of the polarization layer, contrast and light efficiency may be improved.

In an embodiment, the first color filter CF1 may be provided to overlap the light receiving area RA. The first color filter CF1 may be one of a red color filter, a green color filter, and a blue color filter according to color light sensed by the light receiving layer LRL. For example, when the light receiving layer LRL absorbs light of a green wavelength band, the first color filter CF1 may be the green filter. That is, the first color filter CF1 may be set regardless of a light emission color of adjacent pixels.

Meanwhile, the black matrix BM and the color filters CF1 and CF2 may function as an antireflection layer that blocks reflection of external light. Since the display panel 100 includes the black matrix BM and the color filters CF1 and CF2 functioning as the antireflection layer, a separate polarization layer may not be included in the display device 1000. Accordingly, a luminance decrease may be prevented and a thickness of the display panel 100 may be minimized.

In an embodiment, the refractive layer RFL may be disposed on the color filters CF1 and CF2. The refractive layer RFL may include sub-refractive layers having different refractive indices. The refractive layer RFL may change a path of light reflected by an external object and incident onto the light receiving element LRD and a path of the light emitted from the light emitting element LED. The refractive layer RFL is described in detail later with reference to FIGS. 5A to 9.

In an embodiment, the window WIN may be further included on the refractive layer RFL. The window WIN serves to cover and protect structures disposed thereunder. The window WIN may be attached on the refractive layer RFL through an adhesive member. For example, the adhesive member may include optically clear adhesive (OCA), super view resin (SVR), pressure sensitive adhesive (PSA), or optically clear resin (OCR).

The window WIN may be formed of a transparent material. The window WIN may include plastic, and in this case, the window WIN may have a flexible property. A thickness of the window WIN may be 500 μm.

An example of the plastic applicable to the window WIN may include, polyimide, polyacrylate, polymethylmethacrylate, polycarbonate, polyethylene naphthalate, polyvinylidene chloride, polyvinylidene, polystyrene, ethylene vinylalcohol copolymer, polyethersulphone, polyetherimide, polyphenylene sulfide, polyallylate, tri-acetyl cellulose, and cellulose acetate propionate, but is not limited to. The window WIN may include one or more of the plastic materials listed above.

Figure 4:
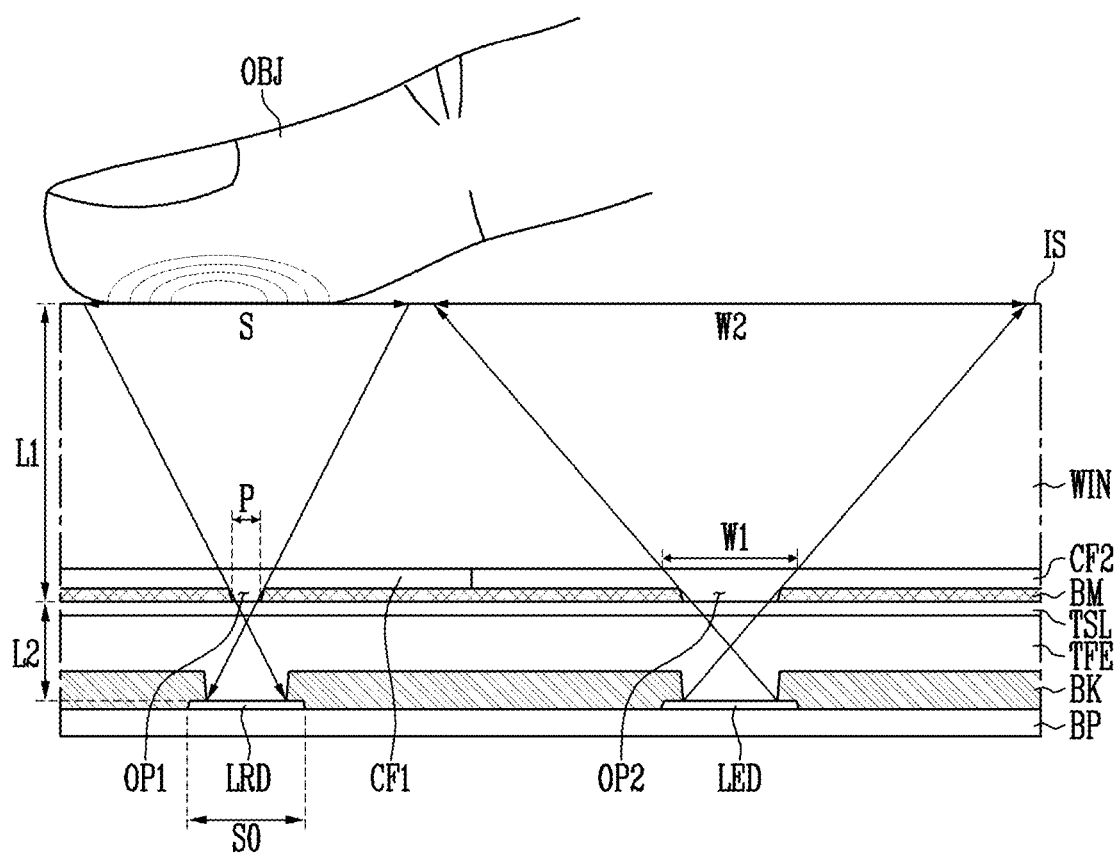
FIG. 4 is a diagram schematically illustrating the cross-sectional view of FIG. 3 in order to describe a sensing area of a light receiving element and front surface light efficiency of a light emitting element.

FIG. 4 is a diagram schematically illustrating the cross-sectional view of FIG. 3 in order to describe a sensing area of the light receiving element and front surface light efficiency of the light emitting element. The sensing area may be a fingerprint acquisition area when the light receiving element functions as a fingerprint sensor.

Referring to FIGS. 1 and 4, the sensing area S (or a width of the sensing area) of the light receiving element LRD may be calculated by Equation 1 below.

$$S = P + \frac{L1}{L2}(P + S0) \qquad \text{[Formula 1]}$$

where S is the sensing area, P is a width of the first opening OP1, L1 is a vertical distance from a lower surface of the black matrix BM to an upper surface of the window WIN, L2 is a vertical distance from the lower surface of the black matrix BM to an upper surface of the light receiving element LRD, and S0 is a width of the light receiving element LRD.

The display device 1000 may include the window WIN on the color filters CF1 and CF2 to protect against external impact. However, since the vertical distance L1 from the lower surface of the black matrix BM to the upper surface of the window WIN increases due to the thickness of the window WIN, the width of the sensing area S of the light receiving element LRD may increase. For example, when the light receiving element LRD is a fingerprint sensor, an object OBJ contacted on the window WIN may be a user's finger, and in order to distinguish a ridge and a valley of the fingerprint, a width of the sensing area S of each of the light receiving element LRD is required to be less than a period of the fingerprint. However, when the width of the sensing area S increases, fingerprint sensing resolution may decrease.

Meanwhile, due to the thickness of the window WIN, when the vertical distance L1 from the lower surface of the black matrix BM to the upper surface of the window WIN increases the front surface light efficiency of the light emitting element LED may decrease. The front surface light efficiency may be defined as a ratio of light emitted toward a front surface (or a display surface IS) among the light emitted from the light emitting element LED. For example, a first front surface area when the window WIN is not attached may have a first width W1 and a second front surface area when the window WIN is attached may have a second width W2 which is greater than the first width W1. The front surface light efficiency in a region corresponding to the second front surface area may be less than a region corresponding to the first front surface area.

Hereinafter, a method of decreasing the width of the sensing area S of the light receiving element LRD and improving the front surface light efficiency of the light emitting element LED by disposing the refractive layer RFL of FIG. 3 between the window WIN and the light receiving element LRD even though the display device 1000 includes the window WIN is described.

Figure 5A:
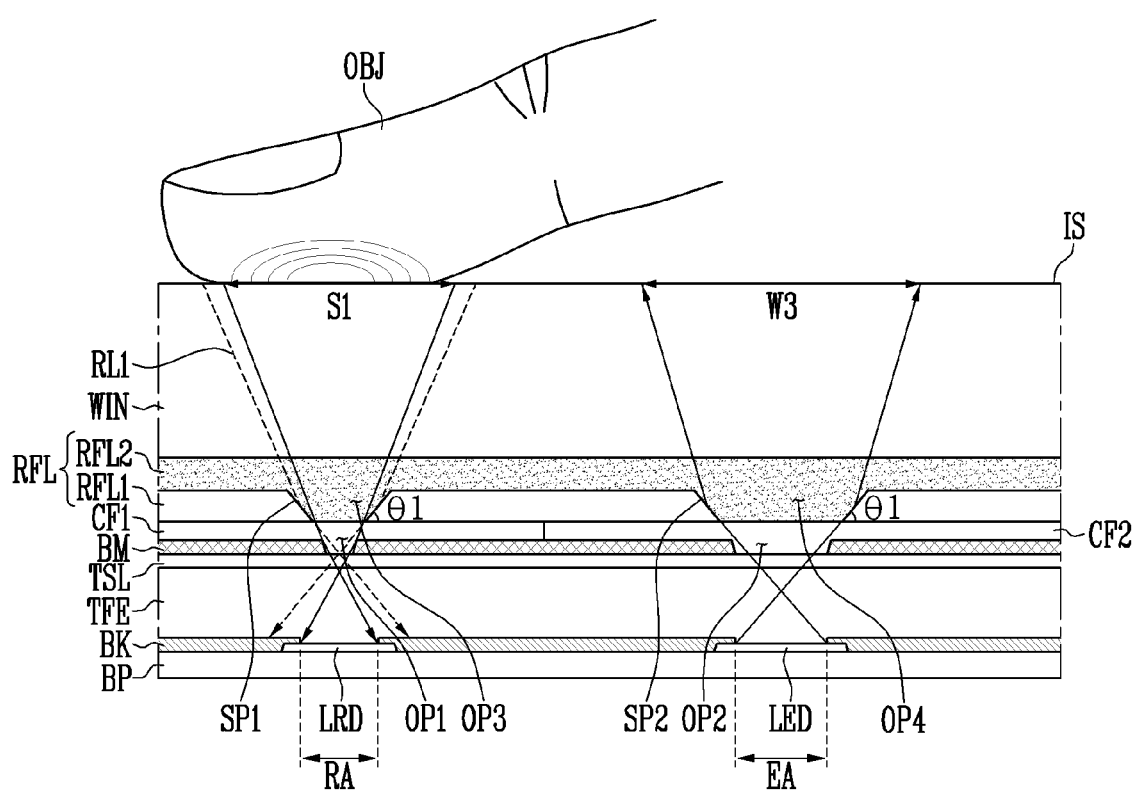
FIG. 5A is a cross-sectional view of a display device including a refractive layer according to an embodiment.
Figure 5B:
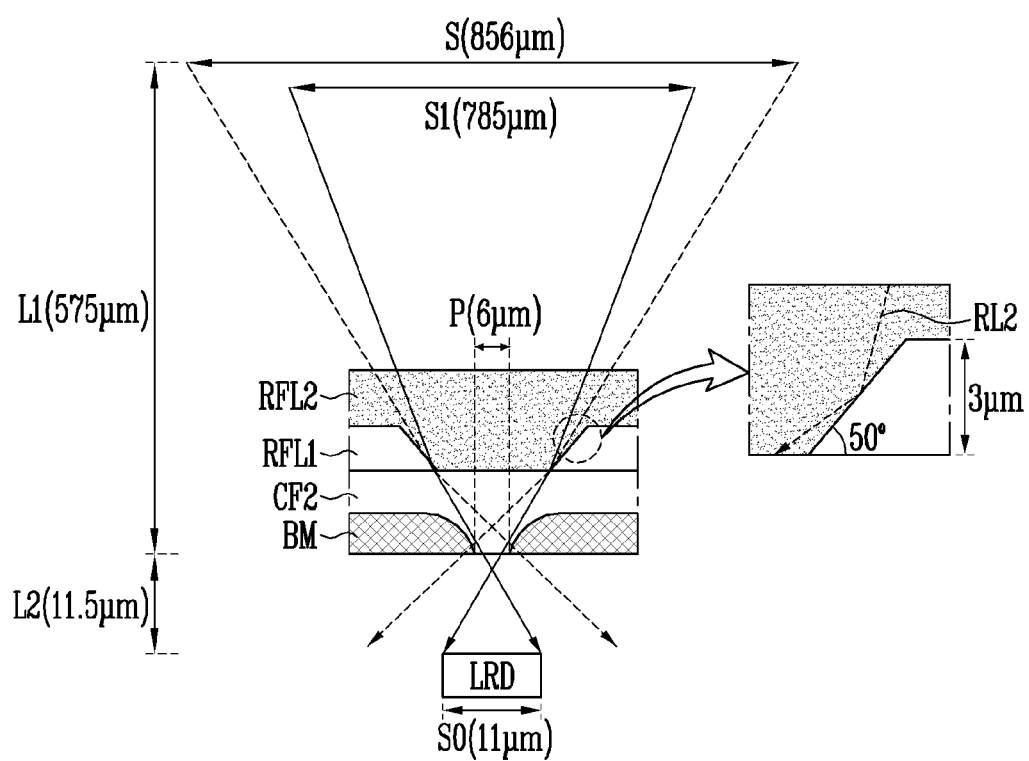
FIG. 5B is a diagram illustrating a light path changed by the refractive layer shown in FIG. 5A.

FIG. 5A is a cross-sectional view of a display device including a refractive layer according to an embodiment. FIG. 5B is a diagram illustrating a light path changed by the refractive layer shown in FIG. 5A.

The embodiment shown in FIG. 5A is different from the embodiment shown in FIG. 4 in that the refractive layer RFL is further included between the color filters CF1 and CF2 and the window WIN.

The refractive layer RFL according to an embodiment may be disposed on the color filters CF1 and CF2 and may include a first refractive layer RFL1 and a second refractive layer RFL2 covering the first refractive layer RFL1. The first refractive layer RFL1 may include a third opening OP3 disposed in an area corresponding to the first opening OP1 and a fourth opening OP4 disposed in an area corresponding to the second opening OP2. The light receiving area RA of the light receiving element LRD may overlap the first opening OP1 and the third opening OP3 in a thickness direction. In addition, the light emitting area EA of the light emitting element LED may overlap the second opening OP2 and the fourth opening OP4 in a thickness direction.

According to an embodiment, the first refractive layer RFL1 may be formed through a photo process. The first refractive layer RFL1 having the third and fourth openings OP3 and OP4 may be formed using photocuring or the like after applying photoresist on the color filters CF1 and CF2 and patterning the photoresist through exposure and development. The second refractive layer RFL2 may be disposed on the first refractive layer RFL1 to fill the third opening OP3 and the fourth opening OP4. The second refractive layer RFL2 may be formed on the color filters CF1 and CF2 while covering the first refractive layer RFL1.

According to an embodiment, a cross section of the third opening OP3 may have a first inclined surface SP1, and a cross section of the fourth opening OP4 may have a second inclined surface SP2. Each of first inclined surface SP1 and the second inclined surface SP2 may be symmetrical about a line passing through a center of the third opening OP3 and the fourth opening OP4, respectively. The first inclined surface SP1 and the second inclined surface SP2 may have a first inclination angle θ1. The first inclination angle θ1 may be an angle for totally reflecting light incident onto the first inclined surface SP1 (for example, reflected light reflected from the object OBJ contacted on the window WIN). For example, the first inclination angle θ1 may be an angle greater than 0° and less than or equal to 57.2°.

According to an embodiment, a refractive index of the first refractive layer RFL1 may be less than a refractive index of the second refractive layer RFL2. The first refractive layer RFL1 may include, for example, an acrylic resin, which is a material having a relatively low refractive index.

In addition, the second refractive layer RFL2 may include, for example, at least one of zirconium oxide (ZrOx), aluminum oxide (AlOx), and titanium oxide (TiOx), and siloxane having a relatively high refractive index.

Referring to FIGS. 5A and 5B, when it is assumed that a width P of the first opening OP1 is 6 μm, the vertical distance L1 from the lower surface of the black matrix BM to the upper surface of the window WIN is 575 μm, the vertical distance L2 from the lower surface of the black matrix BM to the upper surface of the light receiving element LRD is 11.5 μm, and the width S0 of the light receiving element LRD is 11 μm, the width of the sensing area S when no refractive layer RFL is disposed on the color filters CF1 and CF2 may be 856 μm by Equation 1 described above.

On the other hand, when the refractive layer RFL is included, since the first refractive layer RFL1 has the first inclination angle θ1 for totally reflecting the light reflected from the object OBJ and incident on the first inclined surface SP1 because the refractive index of the first refractive layer RFL1 is less than the refractive index of the second refractive layer RFL2. Some of reflected light RL1 may be reflected from the first inclined surface SP1 of the third opening OP3 and may be incident to an outside of the light receiving area RA of the light receiving element LRD. Accordingly, a sensing area S1 of the light receiving element LRD when the refractive layer RFL is disposed between the window WIN and the color filters CF1 and CF2 may decrease than the width of the sensing area S when the refractive layer RFL is not disposed. For example, when a thickness of the first refractive layer RFL is 3 μm and the first inclination angle θ1 is 50°, the sensing area S1 may decrease to 785 μm.

Meanwhile, since the second inclined surface SP2 of the fourth opening OP4 also has the first inclination angle θ1 for totally reflecting the incident light and the refractive index of the first refractive layer RFL1 is less than the refractive index of the second refractive layer RFL2, when the light emitted from the light emitting element LED is incident on the first inclined surface SP1, the light may be totally reflected. Light directed toward a side surface direction of the display device 1000 (refer to FIG. 1) may be reflected from the second inclined surface SP2 and may be emitted in the front surface direction (for example, the display surface IS) of the display device 1000. Accordingly, the front surface light efficiency of the display device 1000 may increase. For example, the front surface area when the refractive layer RFL having the first inclination angle θ1 is included may correspond to a third width W3. The third width W3 which includes the refractive layer RFL may be less than the second width W2 (refer to FIG. 4) which does not include the refractive layer RFL. That is, the front surface light efficiency in a region corresponding to the second width W2 may be greater than the front surface light efficiency of the light emitting element LED in a region corresponding to the first width W1.

Figure 6A:
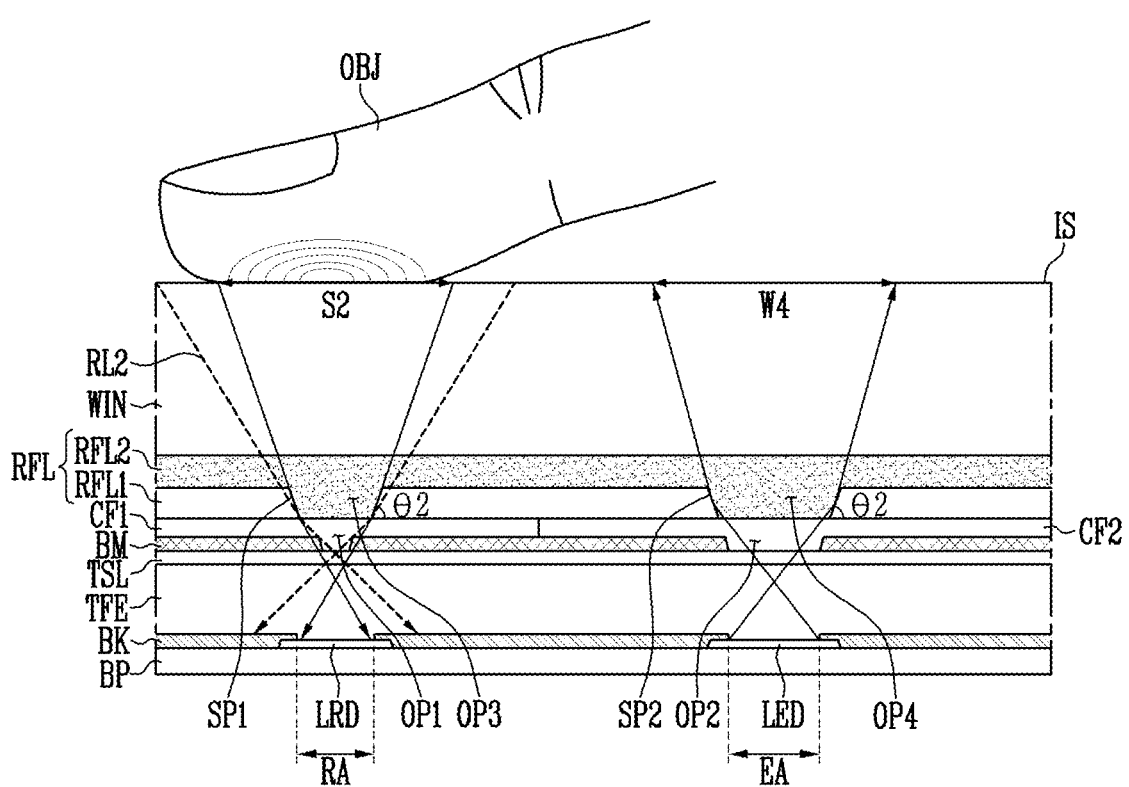
FIG. 6A is a cross-sectional view of a display device including a refractive layer according to an embodiment.
Figure 6B:
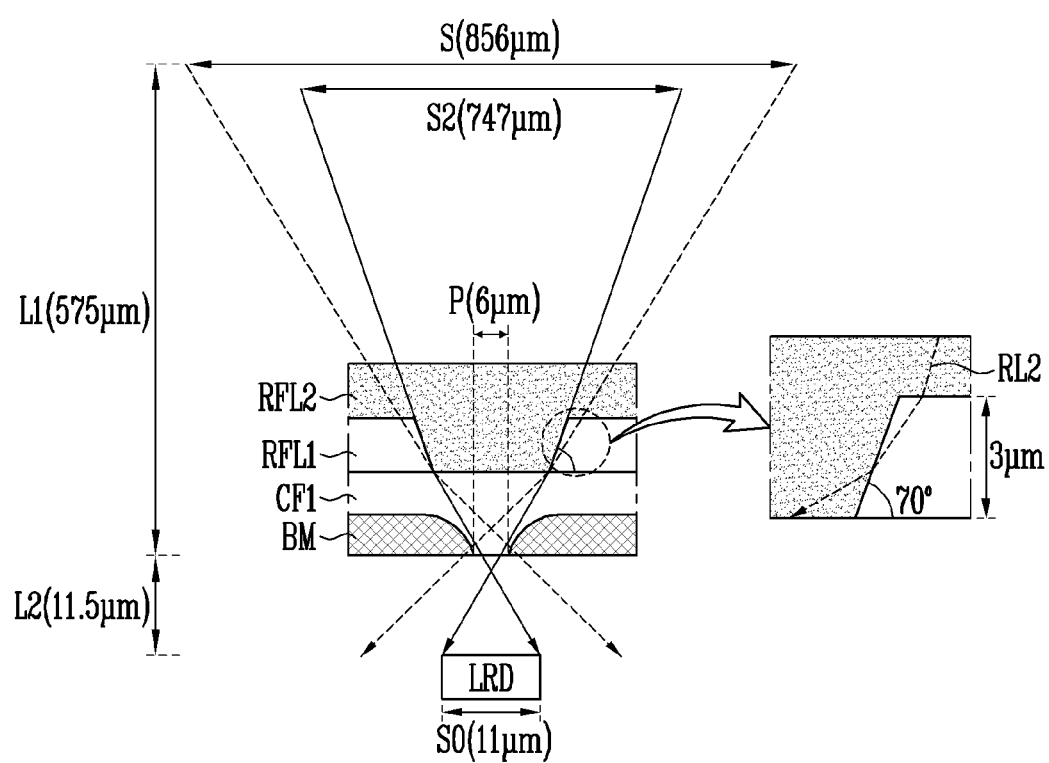
FIG. 6B is a diagram illustrating a light path changed by the refractive layer shown in FIG. 6A.

FIG. 6A is a cross-sectional view of a display device including a refractive layer according to an embodiment. FIG. 6B is a diagram illustrating a light path changed by the refractive layer shown in FIG. 6A.

The embodiment shown in FIG. 6A is different from the embodiment shown in FIGS. 5A and 5B having the first inclination angle θ1 for totally reflecting the incident light in that the refractive layer RFL has a second inclination angle θ2 for refracting the incident light.

According to an embodiment, the cross section of the third opening OP3 may have the first inclined surface SP1, and the cross section of the fourth opening OP4 may have the second inclined surface SP2. Each of the first inclined surface SP1 and the second inclined surface SP2 may be symmetrical about a line passing through a center of the third opening OP3 and the fourth opening OP4, respectively. The first inclined surface SP1 and the second inclined surface SP2 may have the second inclination angle θ2. The second inclination angle θ2 may be an angle for refracting light incident on the second inclined surface SP2 (for example, the reflected light reflected from the object OBJ contacted on the window WIN). For example, the second inclination angle θ2 may be an angle greater than 57.2° and less than 90°.

According to an embodiment, the refractive index of the first refractive layer RFL1 may be less than the refractive index of the second refractive layer RFL2.

Referring to FIGS. 6A and 6B, when it is assumed that the width P of the first opening OP1 is 6 μm, the vertical distance L1 from the lower surface of the black matrix BM to the upper surface of the window WIN is 575 μm, the vertical distance L2 from the lower surface of the black matrix BM to the upper surface of the light receiving element LRD is 11.5 μm, and the width S0 of the light receiving element LRD is 11 μm, the width of the sensing area S when the refractive layer RFL is not disposed between the window WIN and the color filters CF1 and CF2 may be 856 μm by Equation 1 described above.

On the other hand, when the refractive layer RFL is included, since the first refractive layer RFL1 has the second inclination angle θ2 for refracting the light incident on the first inclined surface SP1 and the refractive index of the first refractive layer RFL1 is less than the refractive index of the second refractive layer RFL2, some of reflected light RL2 may be refracted from the first inclined surface SP1 of the third opening OP3 and may be incident to the outside of the light receiving area RA of the light receiving element LRD. Accordingly, a sensing area S2 of the light receiving element LRD may decrease than the width of the sensing area S when the refractive layer RFL is not included. For example, when the thickness of the first refractive layer RFL is 3 μm and the first inclination angle θ1 is 70°, the sensing area S1 may decrease to 747 μm.

Meanwhile, since the second inclined surface SP2 of the fourth opening OP4 also has the second inclination angle θ2 for refracting the incident light and the refractive index of the first refractive layer RFL1 is less than the refractive index of the second refractive layer RFL2, when the light emitted from the light emitting element LED is incident on the second inclined surface SP2, the light may be refracted. The light directed toward the side surface direction of the display device 1000 (refer to FIG. 1) may be reflected from the first inclined surface SP1 and may be emitted in the front surface direction (for example, the display surface IS) of the display device 1000. Accordingly, the front surface light efficiency of the display device 1000 may increase. For example, the front surface light are when the refractive layer RFL having the second inclination angle θ2 is included may correspond to a fourth width W4. The fourth width W4 may be less than the third width W3 (refer to FIG. 5A). The front surface light efficiency in a region corresponding to the fourth width W4 may be greater than the front surface light efficiency of the light emitting element LED in a region corresponding to the third width W3.

The light receiving area RA of the light receiving element LRD may overlap the first opening OP1 and the third opening OP3 in a thickness direction. In addition, the light emitting area EA of the light emitting element LED may overlap the second opening OP2 and the fourth opening OP4 in a thickness direction.

Hereinafter, other embodiments are described. In the following embodiment, a description of the same configuration as that of the previously described embodiment is omitted or simplified, and differences are mainly described.

Figure 7:
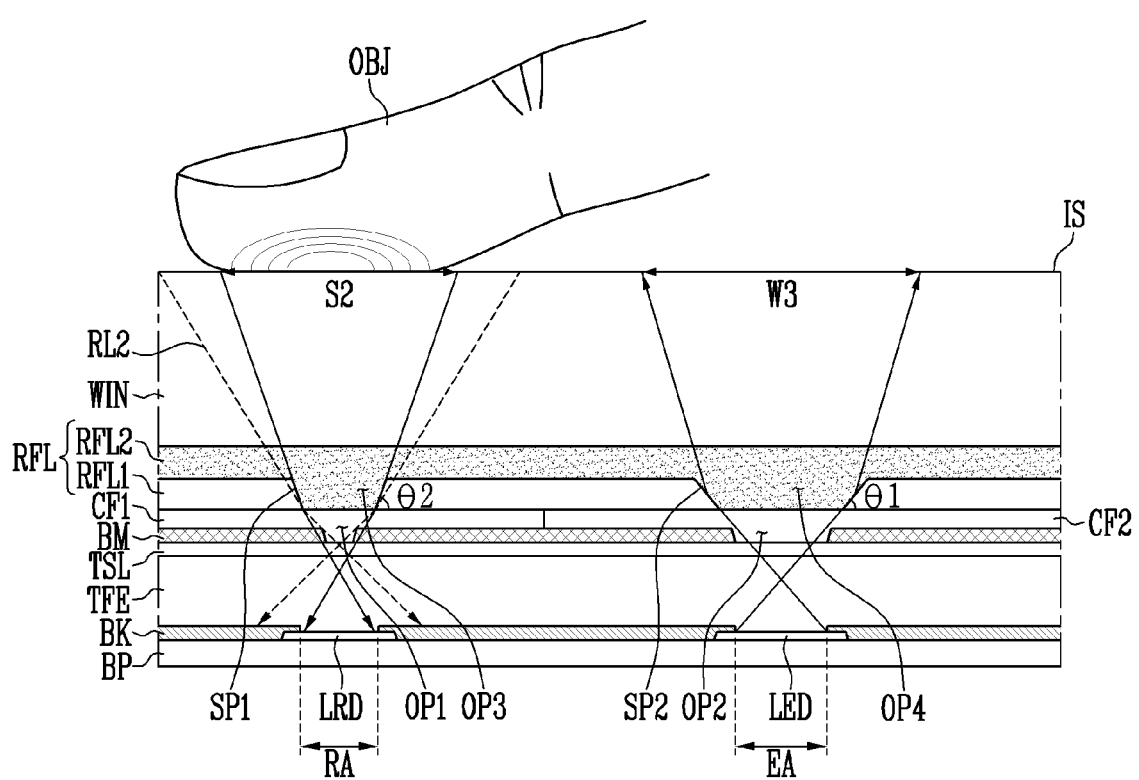
FIG. 7 is a cross-sectional view of a display device including a refractive layer according to another embodiment.

FIG. 7 is a cross-sectional view of a display device including a refractive layer according to another embodiment.

The embodiment shown in FIG. 7 is different from the embodiment shown in FIGS. 5A to 6B in which the inclination angle of the cross section of the third opening OP3 and the inclination angle of the cross section of the fourth opening OP4 are different from each other.

According to an embodiment, the first refractive layer RFL1 may be formed through a photo process. The first refractive layer RFL1 having the third and fourth openings OP3 and OP4 may be formed using photocuring or the like after applying photoresist on the color filters CF1 and CF2 and patterning photoresist through exposure and development. A structure in which the inclination angle of the cross section of the third opening OP3 and the inclination angle of the cross section of the fourth opening OP4 are different may be formed by varying an exposure amount during the photo process.

As shown in FIG. 7, the cross section of the third opening OP3 may have the first inclined surface SP1. The first inclined surface SP1 may be symmetrical about a line passing through a center of the third opening OP3. The first inclined surface SP1 may have the second inclination angle θ2. The second inclination angle θ2 may be an angle for refracting light incident on the first inclined surface SP1 (for example, the reflected light reflected from the object OBJ contacted on the window WIN). For example, the second inclination angle θ2 may be an angle greater than 57.2° and less than 90°. Accordingly, the sensing area S2 of the light receiving element LRD may decrease than the width of the sensing area S (refer to FIG. 4) when the refractive layer RFL is not included.

The cross section of the fourth opening OP4 may have the second inclined surface SP2. The second inclined surface SP2 may be symmetrical about a line passing through a center of the fourth opening OP4. The second inclined surface SP2 may have the first inclination angle θ1. The first inclination angle θ1 may be an angle for totally reflecting light incident on the second inclined surface SP2 (for example, the light reflected from the object OBJ). For example, the first inclination angle θ1 may be an angle greater than 0° and less than or equal to 57.2°. Accordingly, the front surface light efficiency of the display device 1000 may increase. The front surface area of a case where the refractive layer RFL having the first inclination angle θ1 is included may correspond to the third width W3. The third width W3 may be less than the second width W2 (refer to FIG. 4) which corresponds to the front surface area when the refractive layer RFL is not included. That is, the front surface light efficiency in a region corresponding to the third width W3 may be greater than the front surface light efficiency of the light emitting element LED in a region corresponding to the second width W2.

The light receiving area RA of the light receiving element LRD may overlap the first opening OP1 and the third opening OP3 in a thickness direction. In addition, the light emitting area EA of the light emitting element LED may overlap the second opening OP2 and the fourth opening OP4 in a thickness direction.

As described above, by designing the inclination angle of the cross section of the third opening OP3 and the inclination angle of the cross section of the fourth opening OP4 to be different from each other, both of optimization of the sensing area S2 of the light receiving element LRD and optimization of the front surface light efficiency of the light emitting element LED may be implemented.

In general, regarding the optimization of the front surface light efficiency of the light emitting element LED, it may be advantageous to totally reflect light incident onto an interface between the first refractive layer RFL1 and the second refractive layer RFL2 by the inclination angle of the cross section of the fourth opening OP4 having the first inclination angle θ1.

Although not shown, contrary to the embodiment shown in FIG. 7, the cross section of the third opening OP3 may have the first inclination angle θ1 and the cross section of the fourth opening OP4 may have the second inclination angle θ2.

Figure 8:
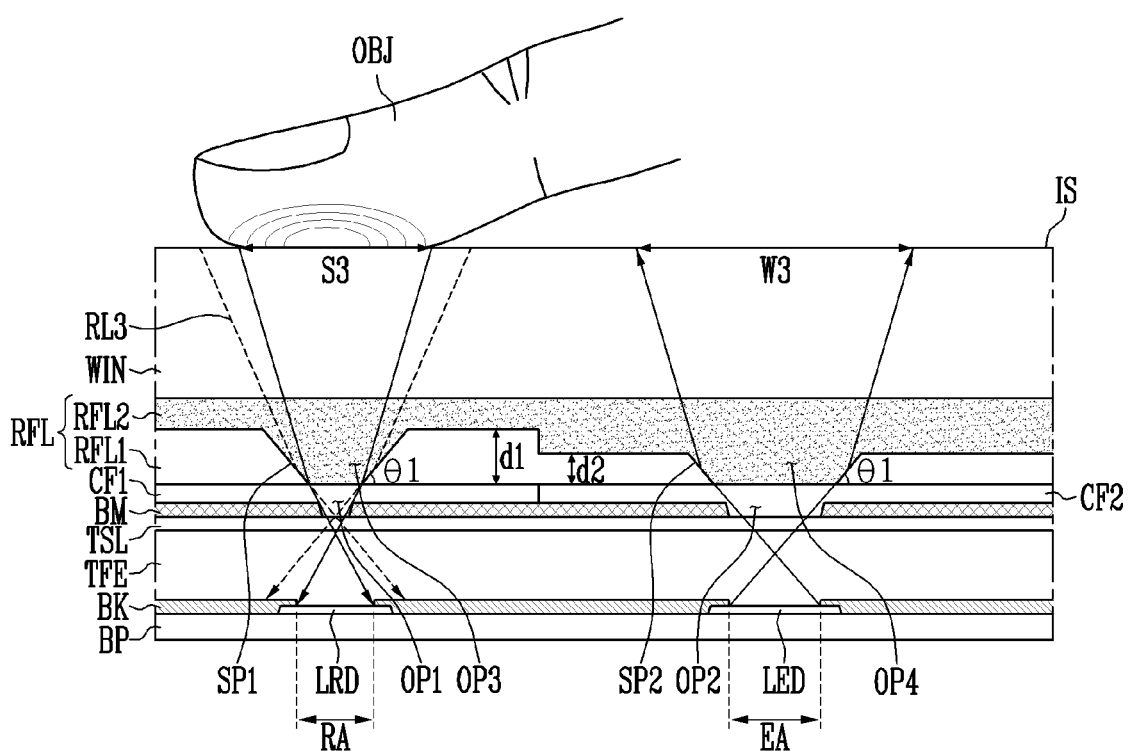
FIG. 8 is a cross-sectional view of a display device including a refractive layer according to still another embodiment.

FIG. 8 is a cross-sectional view of a display device including a refractive layer according to still another embodiment.

The embodiment shown in FIG. 8 is different from the embodiment shown in FIGS. 5A and 5B in that the first thickness d1 of the first refractive layer RFL1 in which the third opening OP3 is formed and the second thickness d2 of the first refractive layer RFL1 in which the fourth opening OP4 is formed are different from each other.

According to an embodiment, the first refractive layer RFL1 may be formed through a photo process. The first refractive layer RFL1 having the third and fourth openings OP3 and OP4 may be formed using photocuring or the like after applying photoresist on the color filters CF1 and CF2 and patterning the photoresist through exposure and development. A structure having the first thickness d1 of the first refractive layer RFL1 in which the third opening OP3 is formed and the second thickness d2 of the first refractive layer RFL1 in which the fourth opening OP4 are formed may be formed by carrying out the photo process twice or by using a multi-tone mask, for example, a phase shift mask.

As shown in FIG. 8, cross sections of the third and fourth openings OP3 and OP4 have the first inclination angle θ1, and the thickness d1 of the first refractive layer RFL1 in which the third opening OP3 is formed may be greater than the thickness d2 of the first refractive layer RFL1 in which the fourth opening OP4 is formed. However, the disclosure is not limited thereto, and the first thickness d1 of the first refractive layer RFL1 in which the third opening OP3 is formed may be less than the second thickness d2 of the first refractive layer RFL1 in which the fourth opening OP4 is formed.

When the cross section of the third opening OP3 has the first inclination angle θ1, the width of the sensing area S3 may decrease as the first thickness d1 of the first refractive layer RFL1, in which the third opening OP3 is formed, increases between 0 and a preset value.

Referring to Table 1 below, when the refractive layer RFL is not included, that is, when the first thickness d1 of the first refractive layer RFL1 corresponding to the third opening OP3 is 0 μm, the width of the sensing area S may be 856 μm, when the first thickness d1 is 2.05 μm, the width of the sensing area S3 may be 811 μm, when the first thickness d1 is 3 μm, the width of the sensing area S3 may be 785 μm, when the first thickness d1 is 4 μm, the width of the sensing area S3 may be 751 μm, when the first thickness d1 is 5 μm, the width of the sensing area S3 may be 709 μm, and when the first thickness is 6 μm, the width of the sensing area S3 may be 654 μm. As described above, the width of the sensing area S3 may decrease as the first thickness d1 of the first refractive layer RFL1, in which the third opening OP3 is formed, increases from 0 to 6 μm. However, the width of the sensing area S3 corresponding to the first thickness d1 shown in Table 1 is an exemplary value and is not limited thereto.

TABLE 1

| First thickness (μm) | 0 | 2.05 | 3 | 4 | 5 | 6 |
|---|---|---|---|---|---|---|
| Sensing area (μm) | 856 | 811 | 785 | 751 | 709 | 654 |

Meanwhile, although not shown, also in a case where the cross section of the third opening OP3 has the second inclination angle θ2, the width of the sensing area S3 may decrease as an increase of the first thickness d1 of the first refractive layer RFL1, in which the third opening OP3 is formed, between 0 and a preset value.

Referring to Table 2 below, when the refractive layer RFL is not included, that is, when the first thickness d1 of the first refractive layer RFL1 corresponding to the third opening OP3 is 0 μm, the width of the sensing area S may be 856 μm, when the first thickness d1 is 2.05 μm, the width of the sensing area S3 may be 782 μm, when the first thickness d1 is 3 μm, the width of the sensing area S3 may be 747 μm, when the first thickness d1 is 4 μm, the width of the sensing area S3 may be 709 μm, when the first thickness d1 is 5 μm, the width of the sensing area S3 may be 671 μm, and when the first thickness is 6 μm, the width of the sensing area S3 may be 632 μm. As described above, the width of the sensing area S3 may decrease as the first thickness d1 of the first refractive layer RFL1 corresponding to the third opening OP3 increases in a range between 0 to 6 μm. However, the width of the sensing area S3 corresponding to the first thickness d1 shown in Table 2 is an exemplary value and is not limited thereto.

TABLE 2

| First thickness (μm) | 0 | 2.05 | 3 | 4 | 5 | 6 |
|---|---|---|---|---|---|---|
| Sensing area (μm) | 856 | 782 | 747 | 709 | 671 | 632 |

Referring to Tables 1 and 2, in the same condition, a width decrease effect of the sensing area S3 of a case where the cross section of the third opening OP3 has the second inclination angle θ2 may be greater than that of a case where the cross section of the third opening OP3 has the first inclination angle θ1.

The cross section of the fourth opening OP4 may have the second inclined surface SP2. The second inclined surface SP2 may be symmetrical about a line passing through a center of the fourth opening OP4. The second inclined surface SP2 may have the first inclination angle θ1. The first inclination angle θ1 may be an angle for totally reflecting the light reflected from the object OBJ and incident onto the second inclined surface SP2. For example, the first inclination angle θ1 may be an angle greater than 0° and less than or equal to 57.2°. Accordingly, the front surface light efficiency of the display device 1000 may increase. The front surface area of a case where the refractive layer RFL having the first inclination angle θ1 is included may correspond to the third width W3. The third width W3 may be less than the second width W2 (refer to FIG. 4) in which the refractive layer RFL is not included. That is, the front surface light efficiency corresponding to the third width W3 may be greater than the front surface light efficiency of the light emitting element LED corresponding to the second width W2.

As described above, by differently designing the first thickness d1 of the first refractive layer RFL1 in which the third opening OP3 is formed and the second thickness d2 of the first refractive layer RFL1 in which the fourth opening OP4 is formed, both of the optimization of the sensing area S2 of the light receiving element LRD and the optimization of the front surface light efficiency of the light emitting element LED may be implemented.

Figure 9:
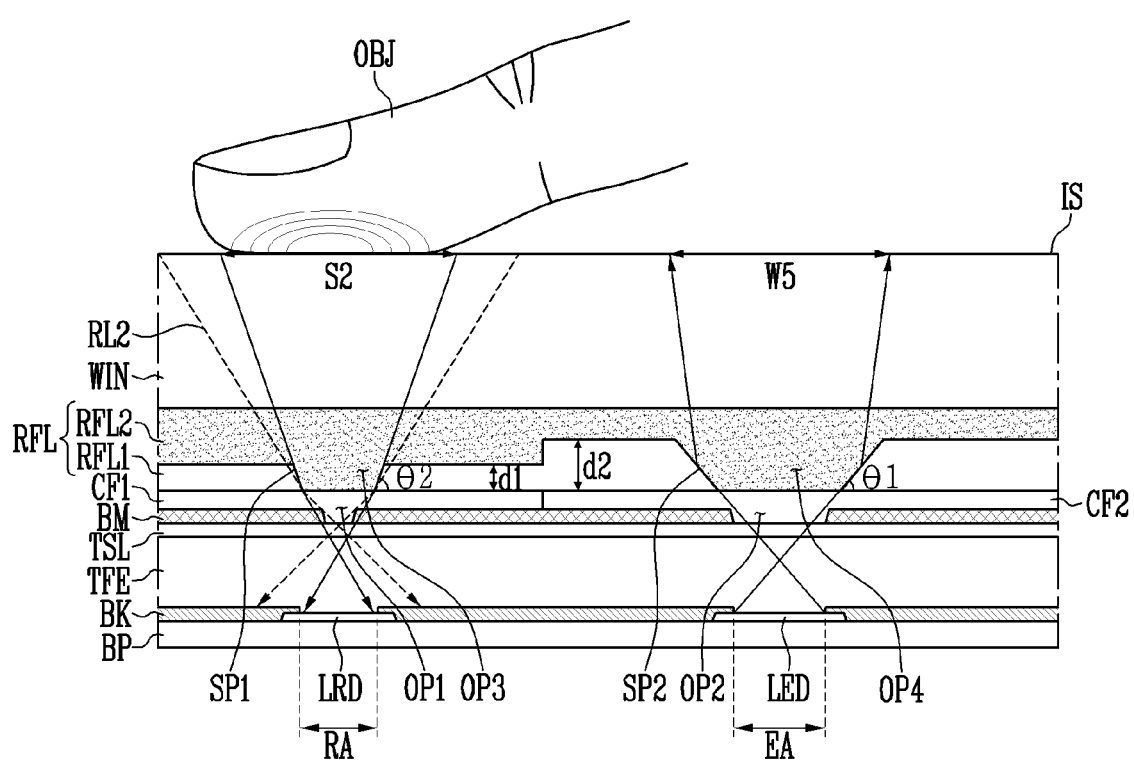
FIG. 9 is a cross-sectional view of a display device including a refractive layer according to still another embodiment.

FIG. 9 is a cross-sectional view of a display device including a refractive layer according to still another embodiment.

The embodiment shown in FIG. 9 is different from the embodiment shown in FIGS. 5A to 6B in that the inclination angle of the cross section of the third opening OP3 and the inclination angle of the cross section of the fourth opening OP4 are different from each other and the first thickness d1 of the first refractive layer RFL1 in which the third opening OP3 is formed and the second thickness d2 of the first refractive layer RFL1 in which the fourth opening OP4 is formed are different from each other.

According to an embodiment, the first refractive layer RFL1 may be formed through a photo process. The first refractive layer RFL1 having the third and fourth openings OP3 and OP4 may be formed using photocuring or the like after applying photoresist on the color filters CF1 and CF2 and patterning the photoresist through exposure and development. A structure in which the inclination angle of the cross section of the third opening OP3 and the inclination angle of the cross section of the fourth opening OP4 are different from each other may be formed by varying the exposure amount during the photo process. A structure in which the first thickness d1 of the first refractive layer RFL1 in which the third opening OP3 is formed and the second thickness d2 of the first refractive layer RFL1 in which the fourth opening OP4 is formed are different from each other may be formed by carrying out the photo process twice or by using a multi-tone mask, for example, a phase shift mask.

As shown in FIG. 9, the cross section of the third opening OP3 may have the first inclined surface SP1. The first inclined surface SP1 may be symmetrical about a line passing through a center of the third opening OP3. The first inclined surface SP1 may have the second inclination angle $\theta2$. The second inclination angle $\theta2$ may be an angle for refracting the light incident on the first inclined surface SP1 (for example, the reflected light reflected from the object OBJ contacted on the window WIN). For example, the second inclination angle $\theta2$ may be an angle greater than 57.2° and less than 90°. Accordingly, the sensing area S2 of the light receiving element LRD may be less than the width of the sensing area S (refer to FIG. 4) when the refractive layer RFL is not included.

The cross section of the fourth opening OP4 may have the second inclined surface SP2. The second inclined surface SP2 may be symmetrical about a line passing through a center of the fourth opening OP4. The second inclined surface SP2 may have the first inclination angle $\theta1$. The first inclination angle $\theta1$ may be an angle for totally reflecting the light reflected from the object OBJ and incident onto the second inclined surface SP2. For example, the first inclination angle $\theta1$ may be an angle greater than 0° and less than or equal to 57.2°.

In addition, the second thickness d2 of the first refractive layer RFL1 in which the fourth opening OP4 is formed may be greater than the first thickness d1 of the first refractive layer RFL1 in which the third opening OP3 is formed. For example, the second thickness d2 shown in FIG. 9 may be greater than the second thickness d2 shown in FIG. 8.

As the second thickness d2 of the first refractive layer RFL1 in which the fourth opening OP4 is formed increases between 0 and a preset value, the front surface light efficiency may increase. For example, the second thickness d2 may also increase from 0 to 6 µm similarly to the first thickness d1, and as the second thickness d2 increases in a range between 0 to 6 µm, the front surface light efficiency may increase.

Accordingly, the front area of a case where the refractive layer RFL having the first inclination angle $\theta1$ and the second thickness d2 is included may correspond to a fifth width W5. The fifth width W5 may be less than the third width W3 (refer to FIG. 8). That is, the front surface light efficiency of the light emitting element LED shown in FIG. 9 may be greater than the front surface light efficiency of the light emitting element LED shown in FIG. 8.

As described above, by designing the inclination angle of the cross section of the third opening OP3, the inclination angle of the cross section of the fourth opening OP4, the first thickness d1 of the first refractive layer RFL1 in which the third opening OP3 is formed, and the second thickness d2 of the first refractive layer RFL1 in which the fourth opening OP4 is formed may be controlled differently as needed, both of the optimization of the sensing area S2 of the light receiving element LRD and the optimization of the front surface light efficiency of the light emitting element LED may be implemented.

Although the disclosure is described with reference to the embodiments of the disclosure, those skilled in the art may understand that the disclosure may be variously corrected and modified within the scope without departing from the spirit and scope of the disclosure described in the claims below.

What is claimed is:

1. A display device comprising:
   a base layer;
   a pixel layer disposed on the base layer and including a light emitting element and a light receiving element;
   an encapsulation layer covering the pixel layer;
   a black matrix disposed on the encapsulation layer and including a first opening disposed in a region corresponding to the light receiving element and a second opening disposed in a region corresponding to the light emitting element;
   a color filter disposed on the black matrix;
   a refractive layer disposed on the color filter and including
      a first refractive layer including a third opening disposed in a region corresponding to the first opening and
      a second refractive layer covering the first refractive layer; and
   a window disposed on the refractive layer,
   wherein a cross section of the third opening has a first inclined surface.

2. The display device according to claim 1, wherein the first inclined surface has a first inclination angle for totally reflecting light reflected from an object that is in contact with the window.

3. The display device according to claim 2, wherein some of the reflected light reflected by the first inclined surface is incident outside a light receiving area of the light receiving element.

4. The display device according to claim 2, wherein the first inclination angle is greater than 0° and less than or equal to 57.2°.

5. The display device according to claim 1, wherein the first inclined surface has a second inclination angle for refracting light reflected from an object that is in contact with the window.

6. The display device according to claim 5, wherein some of the reflected light refracted by the first inclined surface is incident outside a light receiving area of the light receiving element.

7. The display device according to claim 5, wherein the second inclination angle is greater than 57.2° and less than 90°.

8. The display device according to claim 1, wherein a refractive index of the first refractive layer is less than a refractive index of the second refractive layer.

9. The display device according to claim 1, wherein a width of a sensing area of the light receiving element is calculated by Equation 1 below, $$S = P + L1/L2(P+S0) \qquad \text{[Equation 1]}$$

where S is the sensing area, P is a width of the first opening, L1 is a vertical distance from a lower surface of the black matrix to an upper surface of the window, L2 is a vertical distance from the lower surface of the black matrix to an upper surface of the light receiving element, and S0 is a width of the light receiving element.

10. The display device according to claim 9, wherein the width of the sensing area decreases as an inclination angle of the first inclined surface increase.

11. The display device according to claim 10, wherein the width of the sensing area having a second inclination angle for refracting the reflected light is less than that having a first inclination angle for totally reflecting the reflected light reflected from an object that is in contact with the window.

12. The display device according to claim 9, wherein when a thickness of the first refractive layer increases between 0 and a preset value, the width of the sensing area decreases.

13. The display device according to claim 12, wherein the thickness of the second refractive layer is greater than 0 μm and less than or equal to 6 μm.

14. The display device according to claim 1, further comprising:
 a touch sensor layer disposed between the encapsulation layer and the black matrix.

15. The display device according to claim 1, wherein the first refractive layer includes a fourth opening disposed in a region corresponding to the second opening and a cross section of the fourth opening has a second inclined surface.

16. The display device according to claim 15, wherein the second inclined surface has a third inclination angle for totally reflecting emitted light emitted from the light emitting element or a fourth inclination angle for refracting the emitted light.

17. The display device according to claim 16, wherein the third inclination angle is greater than 0° and less than or equal to 57.2°, and the fourth inclination angle is greater than 57.2° and less than 90°.

18. The display device according to claim 15, wherein an inclination angle of the first inclined surface and an inclination angle of the second inclined surface are different.

19. The display device according to claim 15, wherein in a thickness of the first refractive layer, a thickness of an area corresponding to the third opening and a thickness of an area corresponding to the fourth opening are different.

20. The display device according to claim 15, wherein a width of the third opening is less than a width of the fourth opening.

* * * * *